United States Patent [19]

Holdsclaw

[11] Patent Number: 5,173,657
[45] Date of Patent: Dec. 22, 1992

[54] METHOD AND APPARATUS FOR IDENTIFICATION OF ELECTRONIC METER FUNCTION CAPABILITIES

[75] Inventor: Scott T. Holdsclaw, Raleigh, N.C.

[73] Assignee: ABB Power T&D Company, Inc., Blue Bell, Pa.

[21] Appl. No.: 716,911

[22] Filed: Jun. 18, 1991

[51] Int. Cl.[5] .................... G01R 21/06; G01R 1/00
[52] U.S. Cl. ................................. 324/142; 324/157; 361/364
[58] Field of Search ................. 324/142, 157, 156; 361/364

[56] References Cited

U.S. PATENT DOCUMENTS

| | | | |
|---|---|---|---|
| 4,182,983 | 1/1980 | Heinrich et al. | 324/142 |
| 4,663,587 | 5/1987 | Mackenzie | 324/142 |
| 4,963,820 | 10/1990 | Medlin | 324/142 |
| 4,977,368 | 12/1990 | Munday et al. | 324/142 |
| 5,001,420 | 3/1991 | Germer et al. | 361/364 |
| 5,027,056 | 6/1991 | Russillo, Jr. et al. | 324/156 |

Primary Examiner—Ernest F. Karlsen
Attorney, Agent, or Firm—Woodcock Washburn Kurtz Mackiewicz & Norris

[57] ABSTRACT

A method and apparatus for metering electrical energy with a meter having a base of a given configuration is shown to include a data member, attached to the base, for providing a data signal, at least a portion of which is representative of the base configuration, and a processor, connected to the data member, for comparing the meter base configuration to a reference configuration and for providing an indication signal whenever the meter base configuration and the reference configuration do not match. If the data member generates a serial data signal of digital words, it is desireable for a number of bits in each serial communication to be representative of the meter base configuration. Such a serial data signal is achieved if an input/output expander having a plurality of inputs is utilized. In such an embodiment, it is preferred to provide digital signals representative of the meter base configuration to select inputs of the expander. Such digital signals can be provided by first and second voltage sources, representative of logic high and logic low. In an especially preferred embodiment the processor is a register having a micro-processor and a display. The microprocessor compares the data signal to the reference configuration and generates a message displayed on the display whenever the meter base configuration and the reference configuration do not match.

16 Claims, 3 Drawing Sheets

METHOD AND APPARATUS FOR IDENTIFICATION OF ELECTRONIC METER FUNCTION CAPABILITIES

FIELD OF THE INVENTION

The present invention relates generally to the field of electric utility meters. More particularly, the present invention relates to electric utility meters having removable electronic registers, which meters are utilized to meter real and reactive energy in both the forward and reverse directions.

BACKGROUND OF THE INVENTION

Techniques and devices for metering electric energy are well known. Contemporary meters, such as utility power meters, can be of two chassis or base types, namely, electromechanical based meters whose output is generated by a rotating disk or solid state based meters whose output component is generated by all solid state components. If the rotating disk type chassis is coupled with a cooperating optical sensor, the output signal is a pulse train indicative of energy usage. In both types of meter bases, the output signal can be analyzed by a removable electronic register. The register, typically micro-processor controlled, determines energy usage from the output signal. Such removable registers are described in U.S. Pat. No. 4,977,368.

Measurement constants and other energy usage determination factors may vary from meter base to meter base. In view of such variables, it was necessary for skilled personnel using a computer to enter the particulars of the meter base into the register before it was attached. U.S. Pat. No. 4,963,820—Medlin proposed to pre-store such information into a meter base memory for eventual register retrieval. By pre-storing such information, the time and care required to particularize each register with such information was eliminated.

In addition to measurement constants, registers are programmed with software designed for particular metering applications. Depending on the programming provided, registers can analyze meter base generated energy signals representative of various energy usages, namely, real energy in a forward direction, real energy passing in the reverse direction, i.e. user generated energy, and reactive energy, i.e. VAR hours and Q hours, in both forward and reverse directions. However, it is not economically feasible to construct all meter bases capable of generating output signals representative of all types of energy usage. In other words, a meter base configured to meter real and reactive energy in the forward direction may not be capable of generating an output signal representative of real and reactive energy in a reverse direction. Moreover, the difference in physical appearance between such meter bases is not readily apparent.

Registers programmed on the assumption that all meter bases can meter all energy usages results in a significant risk for improper matching of meter base to programmed register for a particular application. For example in a bi-directional metering application, a register programmed for bi-directional metering may make inaccurate metering determinations if attached to a meter base configured for uni-directional metering. Still further, such a mismatch may not become apparent until some time after implementation in the field.

Consequently, a need exists to readily identify a meter base configuration, so that registers programmed for particular applications and meter base capabilities match.

SUMMARY OF THE INVENTION

The previously described problem is resolved and other advantages are achieved in a method and apparatus for metering electrical energy practiced and constructed in accordance with the present invention. In the present invention a meter having a base of a given configuration includes a data member, attached to the base, for providing a data signal, at least a portion of which is representative of the base configuration, and a processor, connected to the data member, for comparing the meter base configuration to a reference configuration. An indication signal is provided whenever the meter base configuration and the reference configuration do not match. If the data member generates a serial data signal of digital words, it is desireable for a number of bits in each word to be representative of the meter base configuration. Such a serial data signal is achieved if an input/output expander having a plurality of inputs is utilized.

Where an expander is utilized, it is preferred to provide digital signals representative of the meter base configuration to select inputs of the expander. Such digital signals can be provided by first and second voltage sources, representative of logic high and logic low.

In an especially preferred embodiment of the present invention, the processor is a register having a micro-processor and a display. The micro-processor compares the data signal to the reference configuration and generates a message displayed on the display member whenever the meter base configuration and the reference configuration do not match.

When reactive energy is to be measured in a meter incorporating the present invention, such a meter will include current sensors for generating an output signal representative of sensed current and a phase shift member for shifting the phase of the output signal in response to a control signal. In such an embodiment, it is preferred for a portion of the data signal to be received by the phase shift member to control the amount of phase shift provided. By controlling the amount of phase shift in the current signal prior to multiplication with the voltage, the reactive energy metered can be either VAR hours or Q hours.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
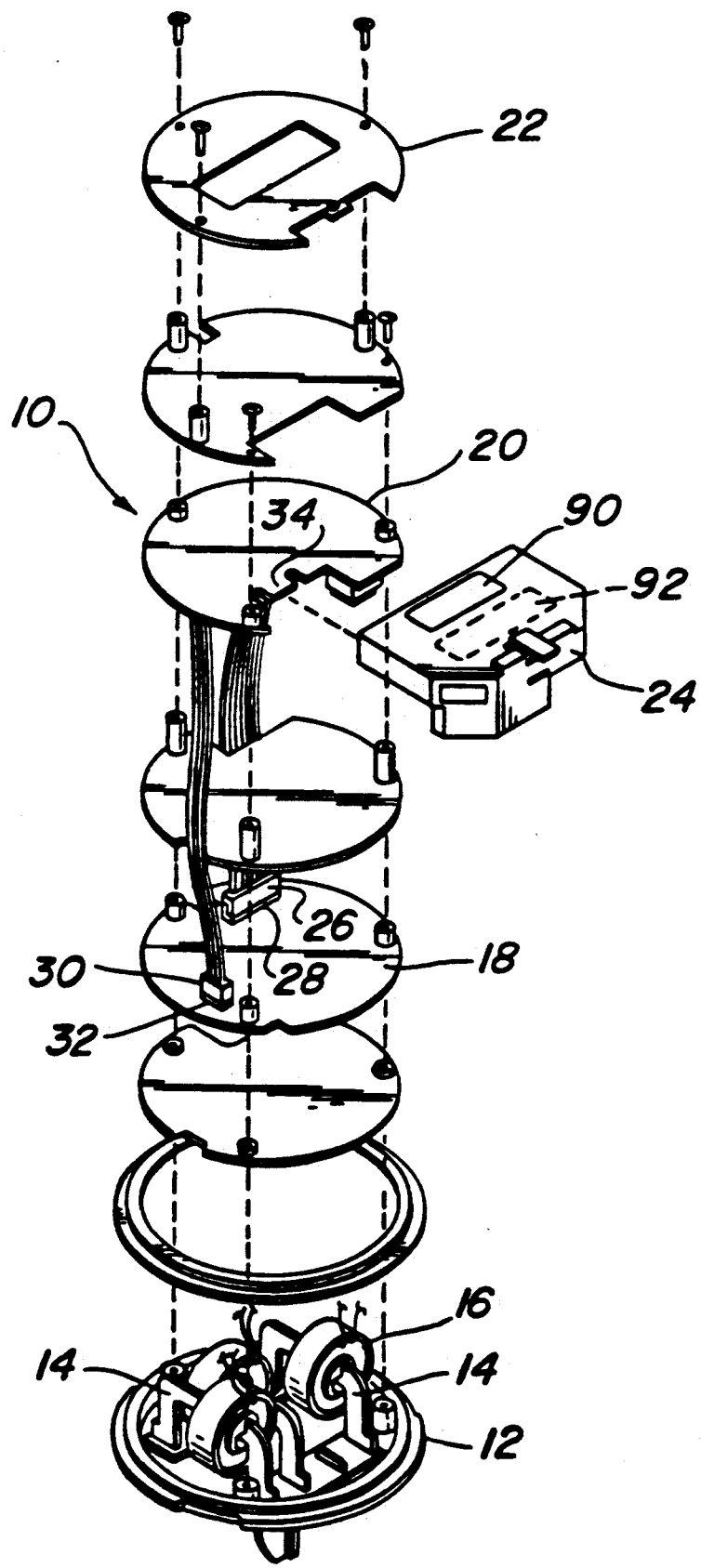
FIG. 1 is a perspective exploded view of a meter constructed in accordance with the present invention.

A new and novel meter for metering electrical energy is shown in FIG. 1 and generally designated 10. Meter 10 is shown to include a base 12, adapted to be mounted to an electrical meter outlet (not shown). Such mounting and/or attachment is well-known. A number of conductive bars 14, which are in direct electrical tact with the meter outlet, extend through and over the 12. It is noted that while the invention is described in relation to a meter constructed to measure three phase electrical energy, the invention is not so limited. The invention can be applied to virtually any type of meter.

A current sensor 16 is attached to each bar 14 which current sensor senses the current of electrical energy flowing through bar 14 and generates an output signal representative of such sensed current. As is also known, such sensed current signal is in fact a voltage signal which changes over time and which has a phase with respect to that phase line voltage associated therewith. As shown in FIG. 1, up to three current sensors 16 may be provided since three phase electrical energy is to be metered, wherein each current sensor monitors a separate phase. As noted above, many other type meter bases are available. The present invention can be applied to all such meter bases and is not limited to only that type base shown in FIG. 1.

Meter 10 also includes a meter printed circuit board 18, a transformer printed circuit board 20, a face plate 22 and a register 24. Although not shown in FIG. 1, a direct electrical connection is made between each of the current sensors 16 and meter board 18. Additionally, insulated conductors (not shown) are connected between each of the line voltages available in the base 12 and transformer board 20. It will be noted that the voltage transmitted from the base 12 is stepped down by transformers contained on transformer board 20. The output of such transformers are utilized for voltage sources and as metering information. The output of the voltage sensing transformers contained on transformer board 20 are provided to connector 26. Meter board 18 is connected to transformer board 20 via connectors 26, 28, 30 and 32. As will be appreciated from FIG. 1, a connector positioned on one side of register 24 slides onto and makes electrical contact with connector 34 on transformer board 20. It will be appreciated after a review of FIGS. 2 and 3, that a data signal representative of the configuration of base 12 is generated on meter board 18 and transmitted through transformer board 20 to register 24 for processing.

It will be understood that every electrical meter base has a given configuration, depending on the electrical energy to be metered. Such configuration will allow a measurement of real energy in either the forward or reverse direction or will permit the measurement of reactive energy, i.e., VAR hours and Q hours, in either the forward or reverse direction. As will be discussed in greater detail hereafter, in relation to FIG. 3, the configuration of base 12 is also reflected in firmware attached to meter board 18, wherein meter board 18 will either measure VAR hours or Q hours, but not both.

Figure 2:
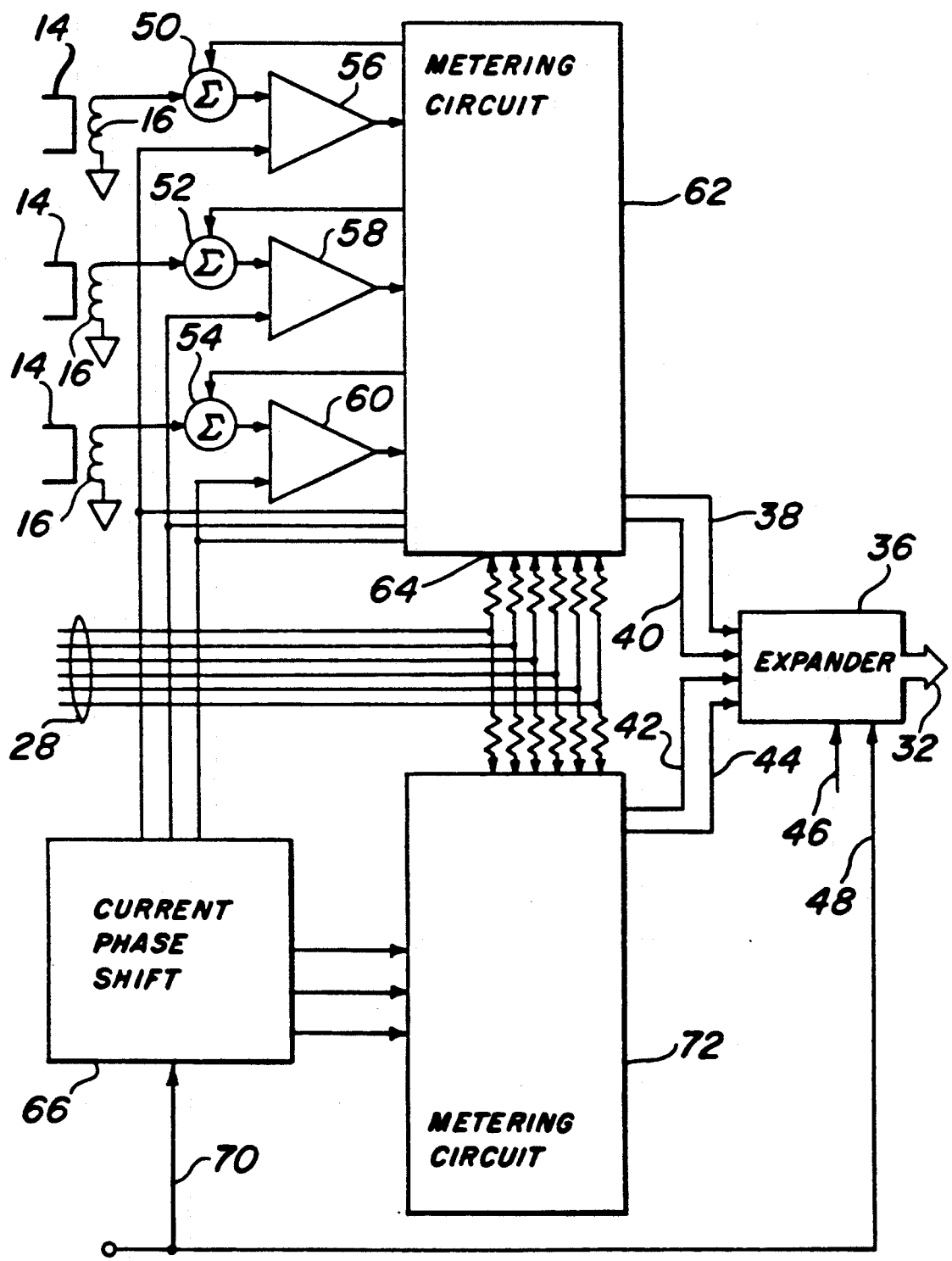
FIG. 2 is a block diagram of the printed circuit meter board of the meter shown in FIG. 1.

Referring now to FIG. 2, meter 10, as contained on meter board 18, includes an I/O expander 36. The output of expander 36 is provided to connector 32. The output provided to connector 32 constitutes a serial data signal, wherein a portion of the data signal is representative of the configuration of base 12. To that end, expander 36 is provided with a plurality of inputs 38 through 48. It will be seen that the signals provided via inputs 46 and 48 are representative of the configuration of base 12. Before discussing the specifics of the signals provided to expander 36, consider first the overall circuit contained in meter board 18.

The output of each current sensor 16 is provided to summers 50, 52 and 54, respectively. The outputs of the summers are provided to a combination integrator and pulse width modulator 56, 58 and 60, respectively. The output of integrators 56–60 are provided as current input signals to circuit 62. The stepped down voltage generated by transformer board 20 from meter base 12 is also provided to circuit 62 at input 64. With the current and voltage signals, circuit 62 operates to calculate watt hours in the forward direction (provided to input 38 of expander 36) and watt hours in the reverse direction (provided to input 40 of expander 36). Circuit 62 also generates current feedback signals which are provided to integrators 56–60 and current signal phase shift integrated circuit 66. Although not critical to practicing the present invention, a more detailed discussion of the operation of circuit 62 can be found in U.S. Pat. No. 4,182,983—Heinrich et al. and U.S. Pat. No. 4,663,587—Mackenzie, both of which are incorporated herein by reference.

The current feedback signals are phase shifted by circuit 66, i.e., delayed, and provided to circuit 72. Circuit 72, in the preferred embodiment, is identical to circuit 62. The phase shifted current signals provided by circuit 66 and the voltage signals received from connector 28 are utilized by circuit 72 to generate signals representative of VAR hours or Q hours, in the forward direction (provided to input 42 of expander 36) and VAR hours or Q hours in the reverse direction (provided to input 44 of expander 36). It is noted that by shifting the phase of the current signal prior to making a power usage calculation, i.e. prior to multiplication with the voltage signal, either VAR hours or Q hours can be metered depending on the amount of phase shift provided. If circuit 72 is to be determining VAR hours, the current feedback signals provided by circuit 62 are phase shifted 90° by circuit 66. Conversely, if circuit 72 is metering Q hours, circuit 66 phase shifts the current feedback signals by 120°. A digital logic signal is provided at 82 which serves both as a control signal for controlling the amount of phase shift provided by circuit 66 as well as being provided to input 48 of expander 36 as an indication that either VAR hours or Q hours are being meter. In the preferred embodiment, expander 36 is a PCF8574 manufactured and sold by Signetics Corporation.

Consider now the signals provided to inputs 46 and 48 of expander 36. Each input is provided with a digital logic signal, i.e., logic high or logic low. In the preferred embodiment, logic high is a positive 6.7 volts while logic low is a negative 6.7 volts. As shown in FIG. 2, the signal provided to input 46 is controlled by switch 74. In the position shown in FIG. 3, switch 74 is connected to a positive 6.7 volts and is providing a logic high to input 46 of expander 36. It will be appreciated that switch 74 can also e a direct electrical connection since switch 74 will not change state once initially set. In the preferred embodiment switch 74 is a direct electrical connection.

Figure 3:
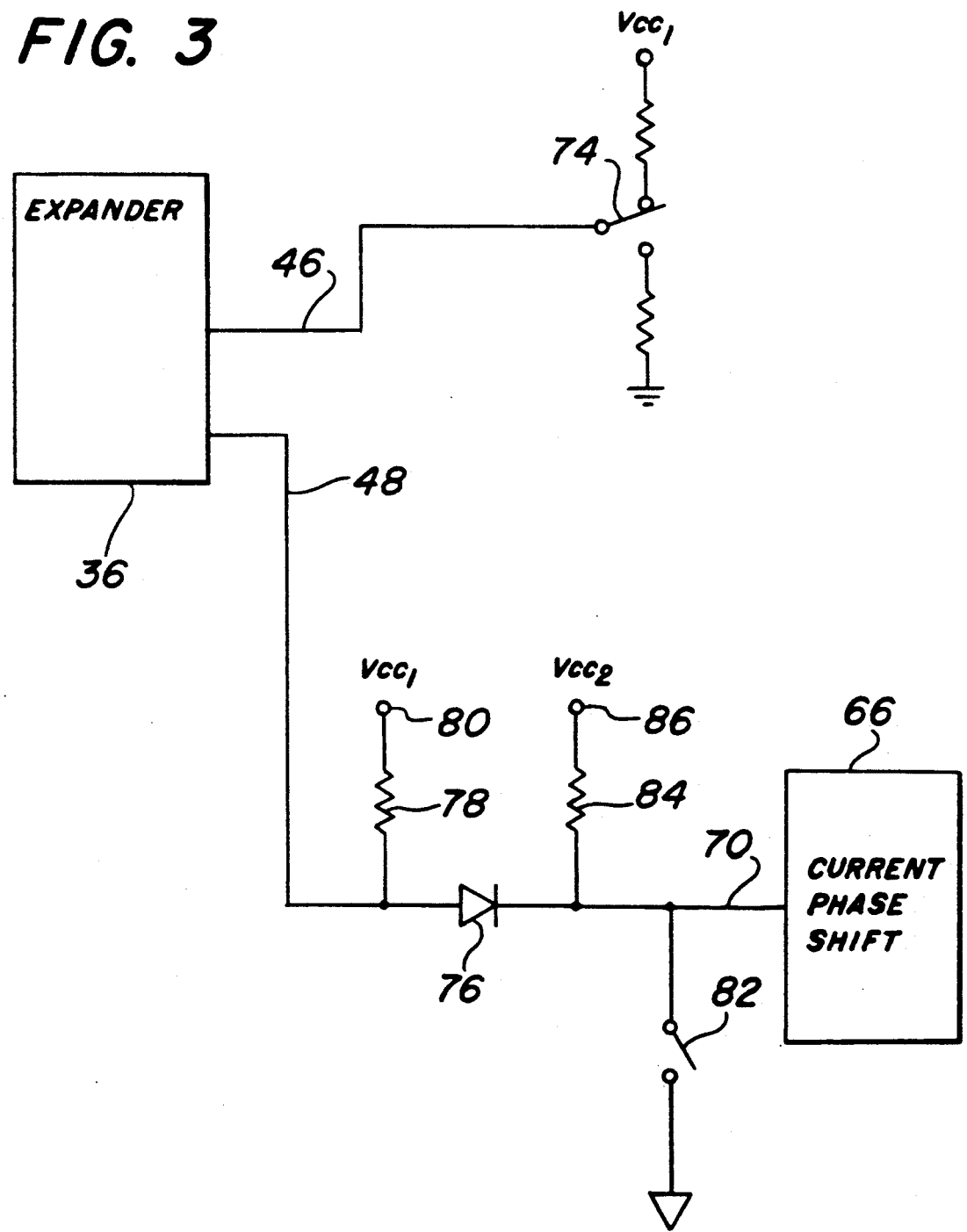
FIG. 3 is a schematic diagram of a further portion of the meter board shown in FIG. 2.

Similarly, input 48 of expander 36 is either provided a logic high or logic low input. As shown in FIG. 3, input 48 is connected to the anode of diode 76. Resistor 78 is connected between the anode of diode 76 and a first voltage source 80, which in the preferred embodiment is about 5 to 6 volts above or more positive than the negative 6.7 volts. The first voltage source 80 is contained in register 24. The cathode end of diode 76 is connected to switch 82 an input 70 of circuit 66. Resistor 84 is connected between the cathode of diode 76 and a second voltage source 86. When switch 82 is closed, a connection is made between the cathode of diode 76 and a third voltage source 88, which in the preferred embodiment is a negative 6.7 volts. It will be appreciated, that while switch 82 is open, input 70 is held substantially at the voltage of second voltage source 86 and input 48 of expander 36 is held substantially at the voltage level of first voltage source 80. Diode 76 may be reversed biased depending on the voltage provided by source 80. The voltage value will depend on the register used. It is noted that meter 10 will function with or without the register. If the register is not used, voltage source 80 will not be present, in which case diode 70 is always reversed biased.

When switch 82 is closed, diode 76 becomes forward biased drawing both input 48 and input 70 to the voltage level of third voltage source 88, i.e., drawings both inputs to a logic low level. Similar to switch 74, in the preferred embodiment, switch 82 is a direct electrical connection.

Consider now the operation of expander 36. Expander 36 is provided with a plurality of parallel input signals appearing at inputs 38 through 48. These inputs signals are sampled and arranged in digital words, wherein each word contains a prescribed number of bits. It will be recalled that expander 36 is generating a serial data signal. A portion of the generated data signal is representative of the configuration of base 12. For example, for the positions shown in FIG. 3 of switches 74 and 82, base 12 is configured to measure energy only in the forward direction and further is configured to measure VAR hours. If switches 74 and 82 were shown in positions opposite that depicted in FIG. 3, base 12 would then be configured to measure both forward and reverse energy and would further be configured to measure Q hours. It will also be appreciated from the above that switches 74 and 82 serve to effectively connect inputs 46 and 48 to either of voltage sources 80 or 88. The signals provided to inputs 46 and 48 of expander 36 will always appear to two particular bits in one digital word. In the preferred embodiment each digital word contains 8 bits with inputs 46 and 48 constituting the 5th and 6th bits in that word.

Consider also the operation of register 24. Register 24 is shown to input a display 90 and a microprocessor 92. Microprocessor 92 receives the serial data output of expander 36, via connectors 30, 32 and 34, and compares the meter base configuration, i.e., the 5th and 6th bit, to a reference configuration stored in register 24. The reference configuration stored in register 24 is representative of that meter configuration necessary in order to measure the desired energy in a desired direction. Whenever the configuration of base 12 and the configuration stored in register 24 do not match, microprocessor 92 generates an indication signal which is provided to display 90. In other words, an indication or error signal is provided to generate a message displayed on display 90 whenever the configuration of base 12 and the reference configuration do not match.

Furthermore, if register 24 is programmed and downloaded with a reference configuration while on any type meter base which does not have an expander similar to 36, no comparison is made nor error displayed until the register is put on a meter base which does have an expander. Thus, whether meter 10 is assembled in the factory or in the field, one can easily and quickly ascertain whether base 12 is configured to measure the desired energy in a desired direction.

While the invention has been described and illustrated with reference to specific embodiments, those skilled in the art will recognize that modification and variations may be made without departing from the principles of the invention as described herein above and set forth in the following claims.

What is claimed is:

1. Apparatus for identifying meter function capabilities for use in a meter for metering electrical energy, said meter having a base of a given configuration for metering a first type of electrical energy, said apparatus comprising:

data means, attached to said meter base, for providing a data signal, at least a portion of said data signal being representative of the configuration of said base; and processing means, connected to said data means, for determining from said data signal said meter base configuration, for comparing said meter base configuration to a reference configuration and for providing an indication signal whenever said meter base configuration and said reference configuration do not match said processing means comprising a register, said register comprising a micro-processor programmed for metering a second type of electrical energy and a display, wherein said microprocessor compares said data signal to said reference configuration and generates a message displayed on said display whenever said meter base configuration and said reference configuration do not match, thereby indicating that said first and second types do not match.

2. The apparatus of claim 1, wherein said data means generates a serial data signal, said data signal comprising digital words wherein a number of bits in each serial communication of said words is representative of said meter base configuration.

3. The apparatus of claim 2, wherein said data means comprises an input/output expander having a plurality of inputs.

4. The apparatus of claim 3, wherein first and second inputs of said plurality of inputs are provided digital signals representative of said meter base configuration.

5. The apparatus of claim 4, further comprising first and second voltage sources, said first and second being connected to said first and second inputs, wherein the connection of said first and second inputs to said first and second voltage sources is representative of said meter base configuration.

6. The apparatus of claim 5, wherein said first voltage source is a positive voltage source and said second voltage source is a negative voltage source.

7. The apparatus of claim 5, further comprising a meter printed circuit board, wherein said data means is attached to said meter printed circuit board.

8. The apparatus of claim 1, further comprising current sensors for sensing the current of said electrical energy and for generating an output signal representative of sensed current and phase shift means, connected to receive said output signal and a portion of said data signal, for shifting the phase of said output signal in response to a control signal, wherein the portion of said data signal received by said phase shift means constitutes a control signal for controlling the amount of phase shift provided by said phase shift means.

9. A method for identifying meter function capabilities, said method for use in metering electrical energy in a meter having a base of a given configuration for metering a first type of electrical energy, said method comprising the steps of:

providing a data signal, at least a portion of said data signal being representative of the configuration of said base;

providing a register, said register comprising a microprocessor programmed for metering a second type of electrical energy, wherein said microprocessor compares said data signal to a reference configuration to determine when said meter base configuration and said reference configuration do not match, thereby indicating that said first and second types do not match; and generating an indication signal whenever said meter base configuration and said reference configuration do not match.

10. The method of claim 9, wherein said step of generating a data signal comprises the step of generating a serial data signal, said data signal comprising digital words wherein a number of bits in each serial communication of said words is representative of said meter base configuration.

11. The method of claim 10, wherein said step of generating said serial data signal comprises the step of providing an input/output expander having a plurality of inputs.

12. The method of claim 11, further comprising the step of providing digital signals representative of said meter base configuration to first and second inputs of said plurality of inputs.

13. The method of claim 12, further comprising the steps of providing first and second voltage sources and connecting said first and second voltage sources to said first and second inputs, wherein the connection of said first and second inputs to said first and second voltage sources is representative of said meter base configuration.

14. The method of claim 13, wherein said first voltage source is a positive voltage source and said second voltage source is a negative voltage source.

15. The method of claim 9, further comprising the step of providing a display, wherein a message is displayed on said display whenever said meter base configuration and said reference configuration do not match.

16. The method of claim 9, further comprising the steps of providing current sensors for sensing the current of said electrical energy, generating an output signal representative of sensed current and shifting the phase of said output signal in response to a control signal, wherein the portion of said data signal representative of said meter base configuration controls the amount of phase shift provided by said phase shift means.

* * * * *